(12) United States Patent
Swedek et al.

(10) Patent No.: US 8,460,057 B2
(45) Date of Patent: Jun. 11, 2013

(54) COMPUTER-IMPLEMENTED PROCESS CONTROL IN CHEMICAL MECHANICAL POLISHING

(75) Inventors: Boguslaw A. Swedek, Cupertino, CA (US); Bret W. Adams, Sunnyvale, CA (US); Sanjay Rajaram, Sunnyvale, CA (US); David A. Chan, Sunnyvale, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 51 days.

(21) Appl. No.: 13/089,189

(22) Filed: Apr. 18, 2011

(65) Prior Publication Data

US 2011/0195528 A1  Aug. 11, 2011

Related U.S. Application Data

(60) Division of application No. 12/554,745, filed on Sep. 4, 2009, now Pat. No. 7,927,182, which is a division of application No. 11/923,082, filed on Oct. 24, 2007, now Pat. No. 7,585,202, which is a division of application No. 11/467,116, filed on Aug. 24, 2006, now Pat. No. 7,294,039, which is a division of application No. 11/166,022, filed on Jun. 23, 2005, now Pat. No. 7,101,251, which is a continuation of application No. 10/330,687, filed on Dec. 27, 2002, now Pat. No. 6,939,198.

(60) Provisional application No. 60/344,411, filed on Dec. 28, 2001.

(51) Int. Cl.
  *B24B 49/00* (2006.01)
  *B24B 51/00* (2006.01)

(52) U.S. Cl.
  USPC ............. 451/5; 451/6; 451/8; 451/41; 700/12

(58) Field of Classification Search
  USPC .................. 216/88–90; 438/690–693; 451/5, 451/6, 8, 9, 10, 11, 36, 41, 57, 59, 63; 700/29, 700/90, 95, 108, 116, 117, 121
  See application file for complete search history.

(56) References Cited

U.S. PATENT DOCUMENTS

| | | |
|---|---|---|
| 5,036,015 A | 7/1991 | Sandhu et al. |
| 5,069,002 A | 12/1991 | Sandhu et al. |
| 5,081,796 A | 1/1992 | Schultz |
| 5,222,329 A | 6/1993 | Yu |
| 5,240,552 A | 8/1993 | Yu et al. |
| 5,413,941 A | 5/1995 | Koos et al. |
| 5,439,551 A | 8/1995 | Meikle et al. |
| 5,486,129 A | 1/1996 | Sandhu et al. |
| 5,618,447 A | 4/1997 | Sandhu |
| 5,643,048 A | 7/1997 | Iyer |
| 5,643,060 A | 7/1997 | Sandhu et al. |
| 5,658,183 A | 8/1997 | Sandhu et al. |
| 5,663,797 A | 9/1997 | Sandhu |
| 5,700,180 A | 12/1997 | Sandhu et al. |

(Continued)

*Primary Examiner* — Timothy V Eley
(74) *Attorney, Agent, or Firm* — Fish & Richardson P.C.

(57) ABSTRACT

A computer-implemented method for process control in chemical mechanical polishing in which an initial pre-polishing thickness of a substrate is measured at a metrology station, a parameter of an endpoint algorithm is determined from the initial thickness of the substrate, a substrates is polished at a polishing station, and polishing stops when an endpoint criterion is detected using the endpoint algorithm.

13 Claims, 5 Drawing Sheets

U.S. PATENT DOCUMENTS

| | | | |
|---|---|---|---|
| 5,738,562 A | 4/1998 | Doan et al. |
| 5,762,537 A | 6/1998 | Sandhu et al. |
| 5,777,739 A | 7/1998 | Sandhu et al. |
| 5,842,909 A | 12/1998 | Sandhu et al. |
| 5,851,135 A | 12/1998 | Sandhu et al. |
| 5,855,804 A | 1/1999 | Walker |
| 5,910,846 A | 6/1999 | Sandhu |
| 5,936,733 A | 8/1999 | Sandhu et al. |
| 5,997,384 A | 12/1999 | Blalock |
| 6,007,408 A | 12/1999 | Sandhu |
| 6,028,669 A | 2/2000 | Tzeng |
| 6,046,111 A | 4/2000 | Robinson |
| 6,075,606 A | 6/2000 | Doan |
| 6,108,092 A | 8/2000 | Sandhu |
| 6,120,347 A | 9/2000 | Sandhu |
| 6,184,571 B1 | 2/2001 | Moore |
| 6,190,234 B1 | 2/2001 | Swedek et al. |
| 6,190,494 B1 | 2/2001 | Dow |
| 6,191,864 B1 | 2/2001 | Sandhu |
| 6,206,754 B1 | 3/2001 | Moore |
| 6,206,769 B1 | 3/2001 | Walker |
| 6,208,425 B1 | 3/2001 | Sandhu et al. |
| 6,213,845 B1 | 4/2001 | Elledge |
| 6,213,848 B1 | 4/2001 | Campbell et al. |
| 6,230,069 B1 | 5/2001 | Campbell et al. |
| 6,234,878 B1 | 5/2001 | Moore |
| 6,247,998 B1 * | 6/2001 | Wiswesser et al. ............... 451/6 |
| 6,261,151 B1 | 7/2001 | Sandhu et al. |
| 6,287,879 B1 | 9/2001 | Gonzales et al. |
| 6,290,572 B1 | 9/2001 | Hofmann |
| 6,301,006 B1 | 10/2001 | Doan |
| 6,306,009 B1 | 10/2001 | Sandhu et al. |
| 6,319,093 B1 * | 11/2001 | Lebel et al. ....................... 451/6 |
| 6,319,420 B1 | 11/2001 | Dow |
| 6,323,046 B1 | 11/2001 | Agarwal |
| 6,338,667 B2 | 1/2002 | Sandhu et al. |
| 6,350,179 B2 | 2/2002 | Campbell et al. |
| 6,362,105 B1 | 3/2002 | Moore |
| 6,364,742 B1 | 4/2002 | Fukuzawa |
| 6,364,746 B2 | 4/2002 | Moore |
| 6,461,964 B2 | 10/2002 | Hofmann et al. |
| 6,464,560 B2 | 10/2002 | Sandhu et al. |
| 6,464,561 B2 | 10/2002 | Sandhu et al. |
| 6,464,564 B2 | 10/2002 | Sandhu et al. |
| 6,464,824 B1 | 10/2002 | Hofmann et al. |
| 6,468,912 B2 | 10/2002 | Hofmann et al. |
| 6,472,325 B2 | 10/2002 | Hofmann et al. |
| 6,488,566 B2 | 12/2002 | Sandhu et al. |
| 6,492,273 B1 | 12/2002 | Hofmann et al. |
| 6,503,839 B2 | 1/2003 | Gonzales et al. |
| 6,517,412 B2 | 2/2003 | Lee et al. |
| 6,517,668 B2 | 2/2003 | Agarwal |
| 6,520,834 B1 | 2/2003 | Marshall |
| 6,540,588 B2 | 4/2003 | Moore |
| 6,540,591 B1 | 4/2003 | Pasadyn et al. |
| 6,595,830 B1 | 7/2003 | Hewett et al. |
| 6,623,333 B1 | 9/2003 | Patel et al. |
| 6,669,539 B1 | 12/2003 | Amartur |
| 6,676,482 B2 | 1/2004 | Bibby et al. |
| 6,746,958 B1 | 6/2004 | Hewett et al. |
| 6,764,379 B2 | 7/2004 | Finarov |
| 6,776,692 B1 | 8/2004 | Zuniga et al. |
| 6,799,136 B2 * | 9/2004 | Patel et al. .................... 702/127 |
| 6,939,198 B1 | 9/2005 | Swedek et al. |
| 7,097,534 B1 | 8/2006 | Yampolsky |
| 7,101,251 B2 | 9/2006 | Swedek et al. |
| 7,195,540 B2 | 3/2007 | Finarov |
| 7,294,039 B2 | 11/2007 | Swedek et al. |
| 7,585,202 B2 | 9/2009 | Swedek et al. |
| 7,927,182 B2 | 4/2011 | Swedek et al. |
| 2002/0155789 A1 | 10/2002 | Bibby et al. |
| 2004/0082271 A1 | 4/2004 | Wiswesser et al. |
| 2004/0249614 A1 | 12/2004 | Finarov |
| 2005/0020185 A1 | 1/2005 | Zuniga et al. |

\* cited by examiner

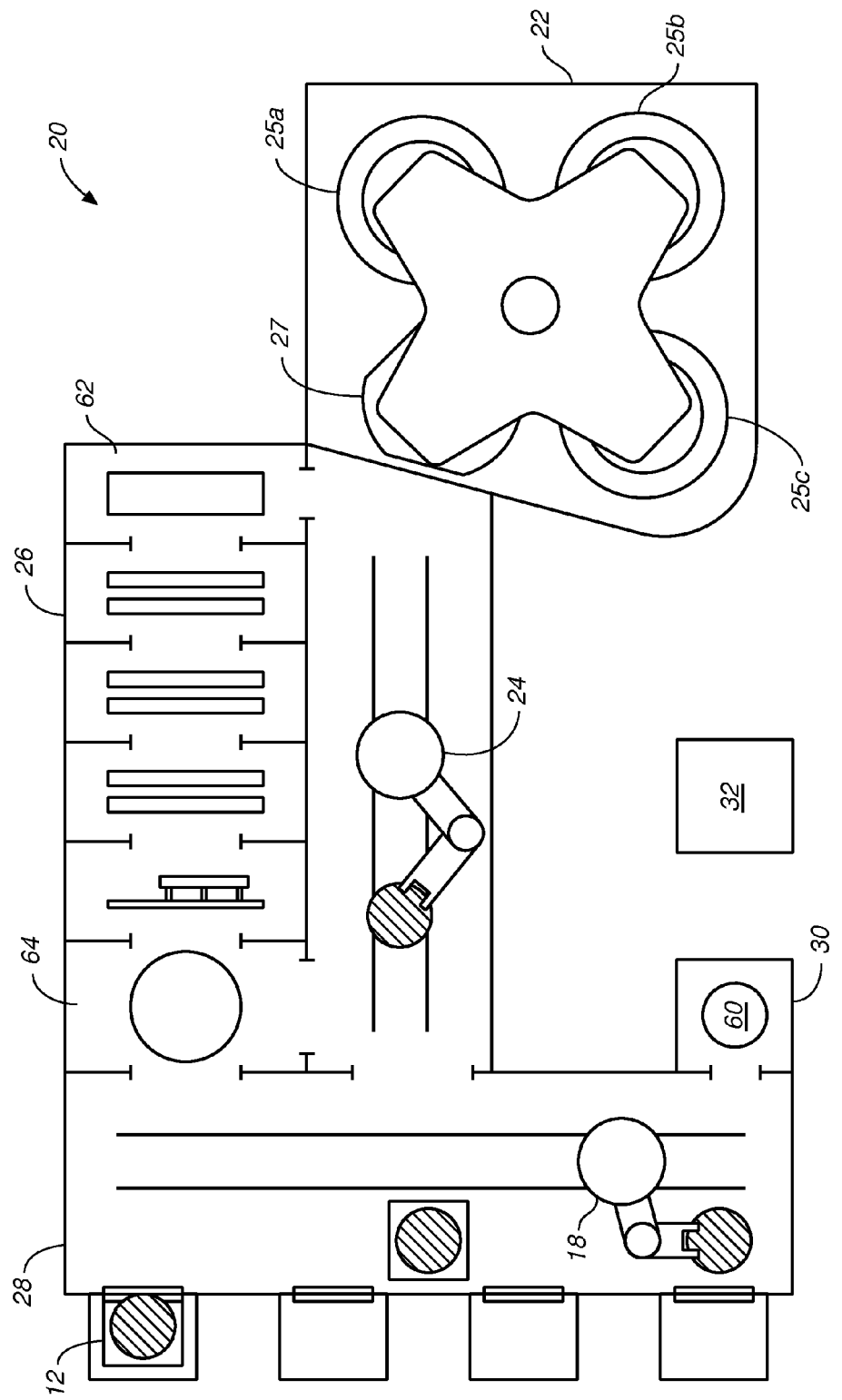
*FIG._1*

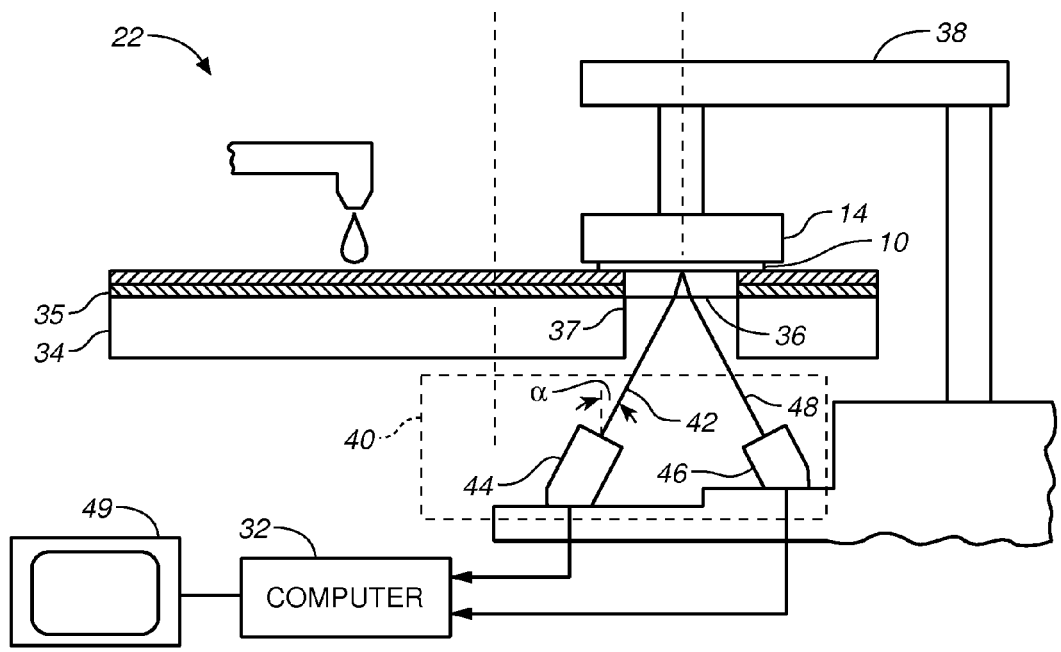
FIG._2

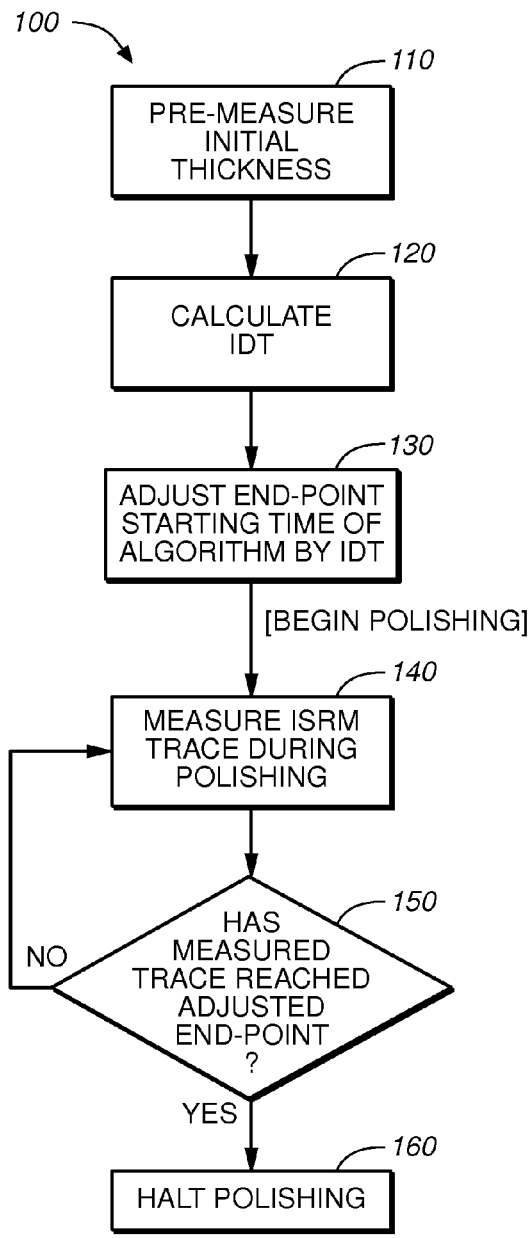
FIG._3
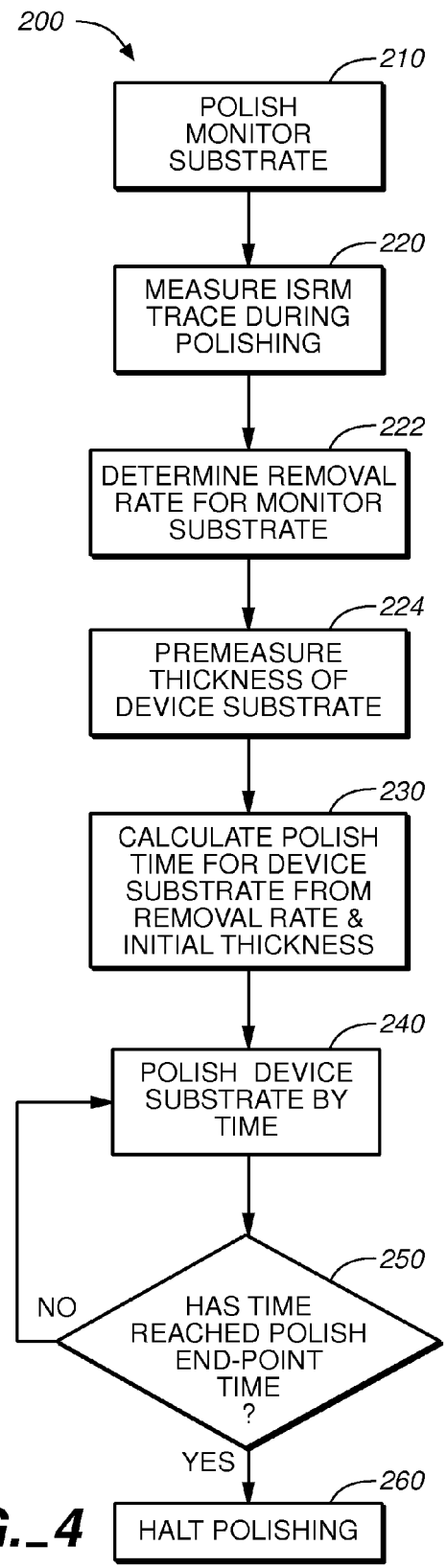
FIG._4

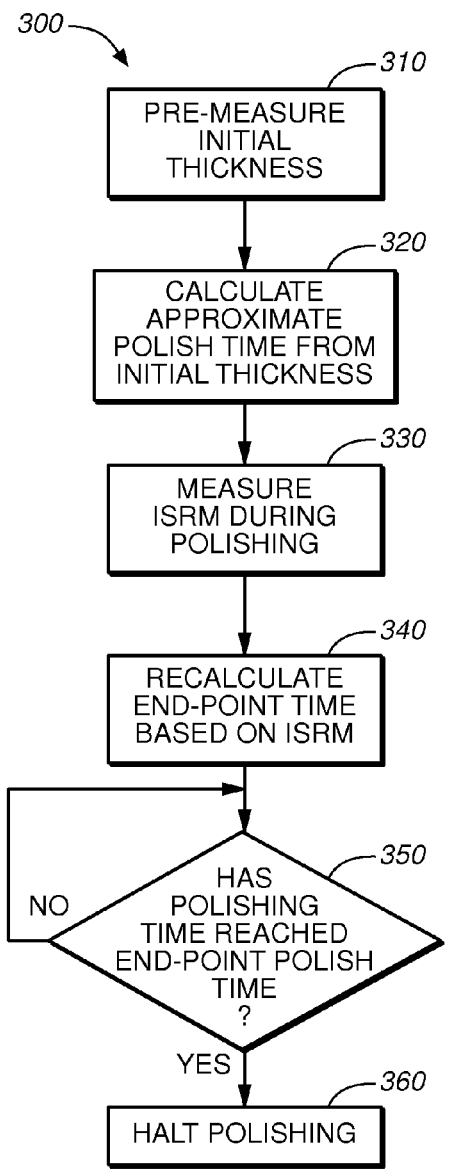
FIG._5
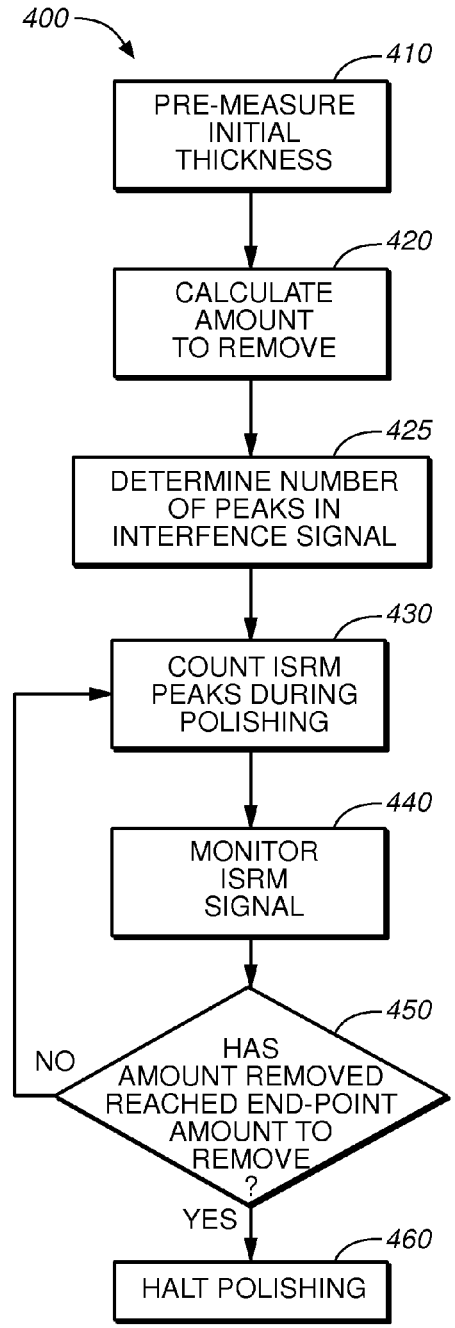
FIG._6

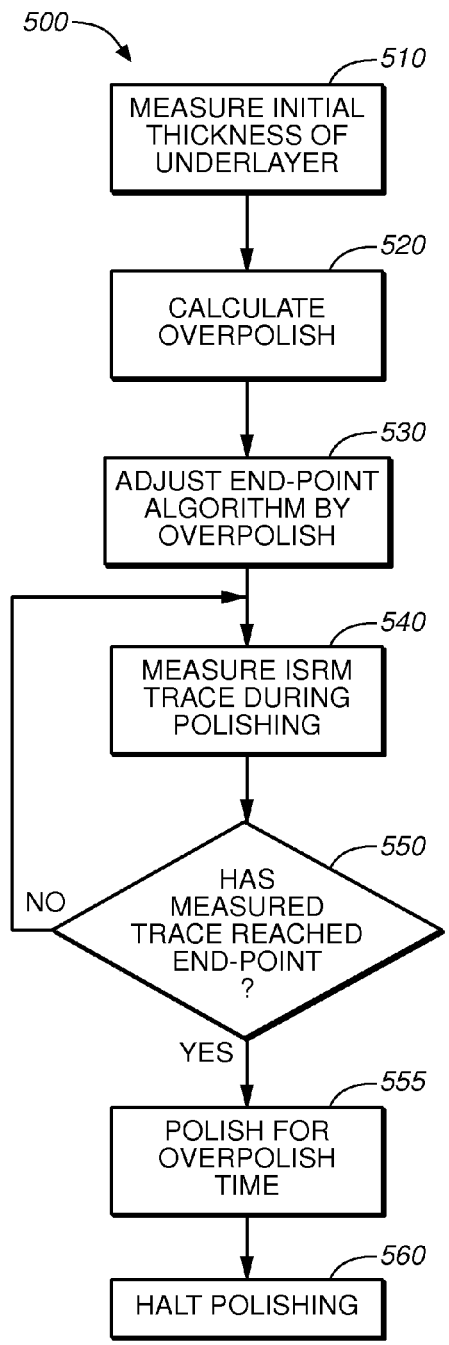
FIG._7
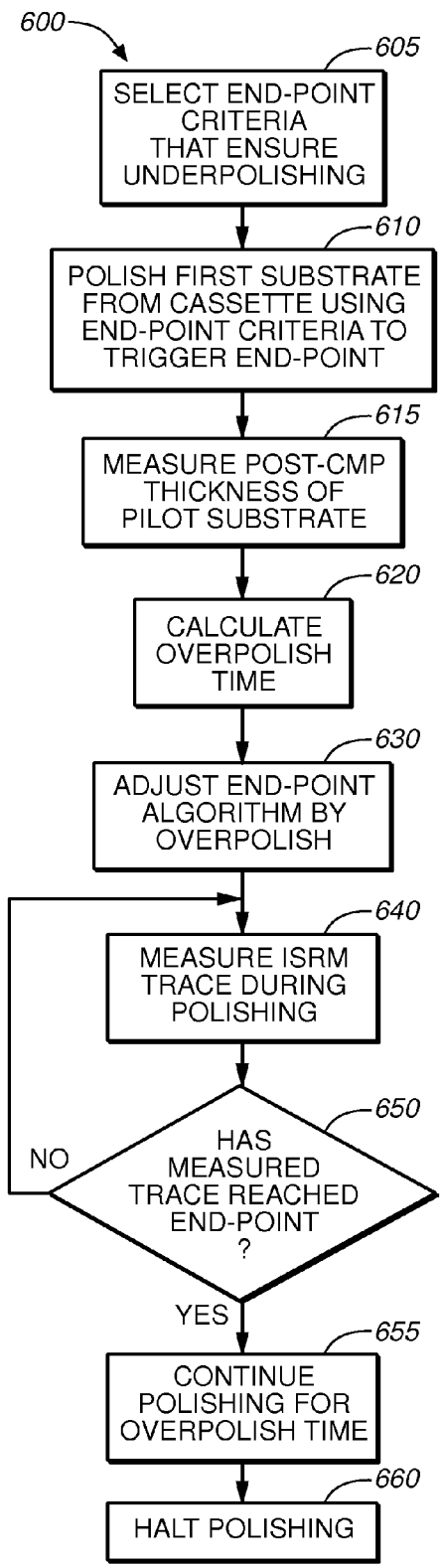
FIG._8

COMPUTER-IMPLEMENTED PROCESS CONTROL IN CHEMICAL MECHANICAL POLISHING

CROSS-REFERENCE TO RELATED APPLICATIONS

This application is a divisional and claims the benefit of priority under 35 U.S.C. Section 120 of U.S. application Ser. No. 12/554,745, filed Sep. 4, 2009, which is a divisional of U.S. application Ser. No. 11/923,082, filed Oct. 24, 2007, now U.S. Pat. No. 7,585,202, which is a divisional of U.S. application Ser. No. 11/467,116, filed Aug. 24, 2006, now U.S. Pat. No. 7,294,039, which is a divisional of U.S. application Ser. No. 11/166,022, filed Jun. 23, 2005, now U.S. Pat. No. 7,101,251, which is a continuation of U.S. application Ser. No. 10/330,687, filed Dec. 27, 2002, now U.S. Pat. No. 6,939,198, which claims the benefit of priority to U.S. Provisional Application Ser. No. 60/344,411, filed on Dec. 28, 2001, the entire contents of which are incorporated herein by reference.

BACKGROUND

The present invention relates generally to chemical mechanical polishing of substrates, and more particularly to methods and apparatus for detecting a polishing endpoint during a chemical mechanical polishing operation.

An integrated circuit is typically formed on a substrate by the sequential deposition of conductive, semiconductive or insulative layers on a silicon wafer. Integrated circuits are typically formed on substrates, particularly silicon wafers, by the sequential deposition of conductive, semiconductive or insulative layers. After each layer is deposited, it is etched to create circuitry features. As a series of layers are sequentially deposited and etched, the outer or uppermost surface of the substrate, i.e., the exposed surface of the substrate, becomes increasingly nonplanar. This nonplanar surface presents problems in the photolithographic steps of the integrated circuit fabrication process. Therefore, there is a need to periodically planarize the substrate surface. In addition, planarization is often needed to remove a filler layer until an underlying stop layer is exposed, or to create a layer with a defined thickness.

Chemical mechanical polishing (CMP) is one accepted method of planarization. This planarization method typically requires that the substrate be mounted on a carrier or polishing head. Conventionally, the exposed surface of the substrate is placed against a rotating polishing pad, although a linear belt or other polishing surface can be used. The polishing pad may be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad (also, some polishing processes use a "nonabrasive" process).

One problem in CMP is determining whether the polishing process is complete, i.e., whether a substrate layer has been planarized to a desired flatness or thickness or whether an underlying layer has been exposed. If an excessive amount of material is removed (overpolishing), the substrate is rendered unusable. If, on the other hand, if an insufficient amount of material is removed (underpolishing), the substrate must be reloaded into the CMP apparatus for further processing. This is a time-consuming procedure that reduces the throughput of the CMP apparatus.

The polishing rate is sensitive to the slurry composition, the polishing pad condition, the relative speed between the polishing pad and the substrate, and the load on the substrate, as well as the initial substrate topography. In addition, there can be variations in the thickness of the layers in the substrate layers. These variations cause variations in the time needed to reach the polishing endpoint. Therefore, the polishing endpoint cannot be determined merely as a function of polishing time.

Various methods are used to monitor and control the CMP planarity and layer thickness during polishing. For example, the substrate thickness can be monitored in-situ by an optical sensor, such as an interferometer. Alternatively, exposure of an underlying layer and the associated change in reflectivity of the substrate can be detected a reflectometer. In addition, various method are used to measure the layer thickness before or after thickness (e.g., in an in-line metrology station). For example, a spectrometer, such as the NovaScan 210, manufactured by the Nova Corporation of Israel, can be used an in-line metrology device.

Although these techniques are satisfactory, there is still room for improvement in the accuracy of the determination of the polishing endpoint.

SUMMARY

In one aspect, the invention is directed to a computer-implemented method for process control in chemical mechanical polishing. The method includes measuring an initial pre-polishing thickness of a substrate at a metrology station, determining a parameter of an endpoint algorithm from the initial thickness of the substrate, polishing a plurality of substrates at a polishing station, and stopping polishing when an endpoint criterion is detected using the endpoint algorithm.

Implementations of the invention may include one or more of the following features. Each of the plurality of substrates may be monitored in-situ during polishing and generating a monitoring signal. The endpoint algorithm may include processing the monitoring signal to detect a signal feature indicating a final or intermediate endpoint. The parameter may represent an initial delay time before the processing step begins, an overpolish time after detection of the signal feature, a total polishing time, or a number of interference cycles. A polishing rate may be determined from the monitoring signal, and the parameter may be adjusted based on the polishing rate. The adjusting step may occur after a predetermined amount of an expected polish time has elapsed. The first substrate may be one of the plurality of substrates.

In another aspect, the invention is directed to a computer-implemented method for process control in chemical mechanical polishing. The method includes measuring an initial pre-polishing thickness of a monitor substrate at a metrology station, determining a delay parameter of an endpoint algorithm from the initial thickness of the monitor substrate, polishing a product substrate at a polishing station, waiting for the delay parameter once polishing of the product substrate has commenced, monitoring the product substrate in-situ during polishing after the delay step to detect the endpoint criterion, and stopping polishing when the endpoint criterion is detected.

In another aspect, the invention is directed to a computer-implemented method for process control in chemical mechanical polishing. The method includes polishing a monitor substrate, monitoring the monitor substrate in-situ during the polishing step to determine a lot representative removal rate, measuring an initial substrate thickness of a product substrate at a metrology station, calculating an endpoint time from the initial substrate thickness and the lot representative removal rate, polishing the product substrate, and stopping polishing of the substrate at the endpoint time.

In another aspect, the invention is directed to a computer-implemented method for process control in chemical mechanical polishing. The method includes measuring an initial substrate thickness of a product substrate at a metrology station, polishing the product substrate, monitoring the product substrate in-situ during polishing to determine a polishing rate, calculating an endpoint time from the initial thickness and the polishing rate, and stopping polishing of the substrate when the endpoint time is detected.

In another aspect, the invention is directed to a computer-implemented method for process control in chemical mechanical polishing. The method includes measuring an initial thickness of a product substrate at a metrology station, determining a target amount to remove from the initial substrate thickness and a selected target thickness, determining an endpoint criterion based on the amount to remove, monitoring the substrate with an in-situ monitoring system during polishing to detect an actual thickness removed from the substrate, and stopping polishing when the target amount to remove is detected.

In another aspect, the invention is directed to a computer-implemented method for process control in chemical mechanical polishing of a substrate that includes an upper layer with an exposed surface covering a lower layer. The method includes measuring a thickness of the lower layer of a substrate at a metrology station, determining an overpolish time from the thickness of the under-layer wafer, polishing the exposed surface of the substrate, monitoring the substrate with an in-situ monitoring system to detect an intermediate endpoint criterion, and stopping polishing of the substrate when the overpolish time has elapsed after the intermediate endpoint criterion has been detected.

In another aspect, the invention is directed to a computer-implemented method for process control in chemical mechanical polishing. The method includes polishing a monitor substrate, monitoring the monitor substrate with an in-situ monitoring system to detect an intermediate endpoint criterion representing an underpolished state of the substrate, stopping polishing of the monitor substrate when the intermediate endpoint is detected, measuring a post-polishing thickness of the monitor substrate at a metrology station, calculating an overpolish time from a difference between the post-polishing thickness and a desired thickness, polishing a product substrate, monitoring the product substrate with an in-situ monitoring system to detect the intermediate endpoint criterion, and stopping polishing of the substrate when the overpolish time has elapsed after the intermediate endpoint criterion has been detected.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 1 is a schematic plan view of a substrate processing system.

FIG. 2 is a schematic cross-sectional view of a polishing station in the substrate processing system.

FIG. 3 is a flowchart illustrating a method according to the invention.

FIG. 4 is a flowchart illustrating another method according to the invention.

FIG. 5 is a flowchart illustrating another method according to the invention.

FIG. 6 is a flowchart illustrating another method according to the invention.

FIG. 7 is a flowchart illustrating another method according to the invention.

FIG. 8 is a flowchart illustrating another method according to the invention.

Like reference symbols in the various drawings indicate like elements.

DETAILED DESCRIPTION

Referring to FIG. 1, a substrate processing system 20 includes a chemical mechanical polisher 22, a wet robot 24, a cleaner 26, a factory interface module 28, and an in-line metrology station 30. Substrates 10 are transported to the substrate processing system 20 in cassettes 12, and are extracted from the cassettes 12 by a robot 18 in the factory interface module 28 for transport to the polisher 22 or the cleaner 26. The operations of the substrate processing system 20 are coordinated by controller 32, which may include one or more programmable digital computers executing distributed control software. A description of a similar substrate processing system may be found in U.S. patent application Ser. No. 09/543,858, the entire disclosure of which is incorporated herein by reference.

The polisher 22 can be a Mirra® chemical mechanical polisher manufactured by Applied Materials, Inc. of Santa Clara, Calif. A description of a polisher may be found in U.S. Pat. No. 5,738,574, the entire disclosure of which is incorporated herein by reference. An exemplary polisher includes three polishing stations 25a, 25b and 25c, and a transfer station 27. At each polishing station, a substrate undergoes a polishing process defined by multiple polishing parameters, such as the rotation rate of the polishing pad, the rotation rate of the carrier head, the slurry composition and slurry flow rate, the pressure applied to the substrate, and the like. These polishing parameters can be controlled by the controller 32.

Referring to FIG. 2, a polishing station in the polisher includes a rotatable platen 34 that supports a polishing pad 35, e.g., a standard or a fixed-abrasive or polishing pad. A support structure 38 supports a carrier heads 14 that holds a substrate 10 against the polishing pad 35. An aperture 37 is formed in the platen 34, and a transparent window 36 is formed in a portion of the polishing pad 35 overlying the aperture. An optical monitoring system 40, which can function as a reflectometer or interferometer, is secured to the platen 27 beneath the aperture 37 and rotates with the platen 34. The optical monitoring system 40 includes a light source 44, such as a laser, and a detector 46, such as a photodiode. The light source generates a light beam 42 which propagates through transparent window 36 to impinge upon the exposed surface of the substrate 10. The intensity of a reflected beam 48 from the substrate 10 is measured by the detector 46.

In operation, the polisher 22 uses the optical monitoring system 40 to determine the amount of material removed from or remaining on the surface of the substrate during polishing, to determine when the surface has become planarized, or to determine when an underlying layer has been exposed. The light source 44 and the detector 46 are coupled to the controller 32. The controller 32 may be a general purpose digital computer programmed to activate the light source 44 when the substrate generally overlies the window, to store intensity measurements from the detector 46, to display the intensity measurements on an output device 49, to sort the intensity measurements into radial ranges, and to apply the endpoint detection logic to the measured signals to detect the polishing endpoint.

Although the controller for the polishing system, the in-line metrology device and the in-situ endpoint detection system are shown as the same computer, these systems can be implemented as a distributed system, or as a set of independent systems that communicate using a preselected protocol. Moreover, various steps in the methods set forth below need not be performed on the same controller system. For example, the measurement of the initial layer thickness could be forwarded from the controller for the in-line metrology device to the controller for the polishing system. The controller for the polishing system could calculate values for the variables used by the endpoint detection algorithm, and then forward the calculated values to the controller for the in-situ endpoint detection system.

Although an optical monitoring system has been illustrated, the present process can work with other in-situ monitoring systems, such as eddy current, capacitive or vibration sensing systems.

Returning to FIG. 1, the in-line metrology station 30 includes a metrology device 60. The in-line metrology station is located at a position separate from the polishing stations 25a-25c, where the substrate can be placed before or after polishing. For example, the in-line metrology station 30 can be positioned off the factory interface module 28 and accessible by the interface robot 18 as shown, or it can be positioned between the polisher 22 and the factor interface module and be accessible to the wet robot 24, or it can be positioned in the input stage 62 or the output stage of the cleaner 26. In general, the metrology device 60 is capable of measuring the thickness of one or more layers in the substrate, including underlying layers. The metrology device can be a spectrometer, such as the NovaScan 210 manufactured by Nova Corporation of Israel. Other suitable spectrometers that can measure the thickness of layers on the substrate 10 include spectrometers manufactured by KLA-Tencor Corporation and Thermawave Corporation. Since the metrology device 60 operates in-line rather than in-situ, it may be capable of higher accuracy measurements than the optical monitoring system 40.

The overall approach of this invention to obtaining an accurate polishing endpoint is to premeasure the initial thickness of the substrate, or a layer in the substrate, by the in-line metrology device 60 prior to the substrate being polished, and use this data to adjust the endpoint polishing routine.

FIG. 3 illustrates a method 100 according to one implementation of the invention. First, the initial thickness of a layer on the substrate 10 is measured by the in-line metrology device 30 (step 110). The measurement of the layer thickness can be aligned with the critical areas on the substrate 10. The initial thickness is stored in a memory of the controller 32. The controller 32 then calculates an initial dead time (IDT) based on the initial layer thickness (step 120). The initial dead time can be calculated by dividing the difference between the an ideal starting thickness for the endpoint algorithm and the measured initial thickness by an estimated polishing rate.

Next, the controller 32 modifies the endpoint algorithm using the initial dead time. Specifically, the controller adjusts the algorithm so that data collection using the in-situ endpoint detection system 40 begins after expiration of the initial dead time from the start of polishing of the substrate. During polishing, the substrate 10 is placed in contact with the polishing pad 35 and monitored in-situ by the monitoring system 40 (step 140). As noted however, data collection from the monitoring system does not being until after the initial dead time has expired. Once the endpoint detection system begins operating, the controller applies endpoint detection logic to the trace from the monitoring system to detect the endpoint of the polishing process (step 150). Once the endpoint criteria are detected, polishing halts (step 160).

The measurement of the substrate layer thickness and calculation of the IDT can be performed for just the first substrate in a cassette. Subsequently substrates from the same cassette can be polished using the same IDT and adjusted endpoint algorithm.

A potential advantage of this system is that it can prevents the endpoint detection system from triggering too early or too late. Specifically, when a layer having a large thickness, such as oxide layer having a thickness of more than 4000 Angstroms, is to be removed, the method prevents "order skipping", i.e., mistakes by the endpoint detection system when the number of interference cycles is larger than expected. Since the endpoint detection algorithm does not begin until a point near where the expected number of interference cycles remain, "order skipping" can be avoided.

FIG. 4 illustrates a method 200 according to another implementation of the invention. In method 200, the polishing endpoint for the product substrate 10 is determined based on the pre-determined removal rate for a monitor substrate and an initial thickness of the product substrate 10.

Initially, the cassette 12 is delivered to the polisher 22 by the substrate processing system 20. The cassette 12 includes a monitor substrate 15 in addition to the set of regular device substrates 10. The monitor substrate 15 can be a blank oxide-coated wafer. The monitor substrate is polished (step 210) while being in-situ monitored by the system 40 (step 220). The controller 32 determines the polishing rate of the monitor substrate (step 222) based on the signals received from the monitoring system 40. For each device substrate, the initial layer thickness is measured using the in-line metrology system 30 (step 224). The controller calculates the individual polishing time for each individual device substrate 10 (step 230), e.g., by dividing the measured thickness by the polishing rate of the monitor substrate. When the device substrate is being polished (step 240), the controller merely halts polishing (step 260) when the actual polishing time of the device substrate becomes equal to the expected polishing time previously determined by the controller 32 (step 250).

FIG. 5 illustrates a method 300 according to another implementation of the invention. In method 300, both the in-situ removal rate and the in-line measurement of the initial thickness are used to determine the polishing time for the product substrate.

The initial thickness of a layer in a product substrate 10 is measured by the in-line metrology device 30 (step 310). The controller 32 determines an estimated polishing time for the product substrate 10 (step 320) from the initial thickness of the substrate and from a previously stored polishing rate, such as an empirically measured polishing rate or a polishing rate of a previously polished substrate as determine by the optical monitoring system 40. The product substrate 10 is transferred to the polishing station 22 and polished while being monitored by the optical monitoring system 40 (step 330). After a preset amount of the estimated polishing time has occurred, e.g., about 80-90% of the estimated polishing time, the controller calculates the actual removal rate of the polisher 22 from the intensity measurements generated by the in-situ optical monitoring system 40. Then the controller 32 recalculates the polishing endpoint time based on the actual removal rate and the initial thickness of the product substrate (step 340). When the polishing time reaches recalculated endpoint time, the controller halts polishing of the product substrate.

FIG. 6 illustrates a method 400 according to another implementation of the invention. In method 400, the initial thickness is used to calculate the number of interference peaks expected during polishing. The endpoint detection system counts this number of interference peaks before polishing is halted.

The initial thickness of a device substrate 10 is pre-measured by the in-line metrology device 30 (step 410). The controller 32 calculates an amount to be removed from the upper surface of the substrate based on the initial thickness and the target thickness of the layer on the substrate (step 420). The target thickness is a pre-determined value and is stored in the memory of the controller prior to the beginning of the polishing process. An expected number of peaks in the interference signal is then calculated from the amount to be removed (step 425). The product substrate is transferred to the polisher and polished while being in-situ monitored by the optical monitoring system 40 (step 440). The series of intensity values from the reflected beam can be stored in the controller, are analyzed, and the number of peaks in the sinusoidal signal is counted (step 430). When the desired number of peaks has been counted (step 440), polishing is halted. The number of peaks can be a fraction, in which case the endpoint detection system can continue polishing for a partial interference cycle, e.g., by monitoring the slope or other features of the interference signal, or by calculating the average duration of the previous interference cycles and polishing past an interference peak for a time equal to the fraction of the average duration. Alternatively, the desired thickness to be removed can be stored, and the controller can calculate the amount of thickness removed from the number of peaks in the intensity signal.

One problem in CMP endpoint detection is the influence of the refractive index variation and thickness of the underlying layers on the traces measured by the in-situ monitoring system 40. Specifically, when the thickness or the refractive index of the underlying layers vary, the correlation between the signal from the monitoring system 40 and the thickness of the substrate becomes distorted. For example, a large variation in the thickness of an underlying nitride layer may result in a large post-CMP variation of the oxide layer thickness. Although the thickness of the nitride layer can be consistent within a given lot, there can be large lot-to lot variations.

FIG. 7 illustrates a method 500 according to another implementation of the invention. In method 500, the thickness of an underlying layer is used to adjust the endpoint algorithm.

The in-line metrology device 30 is used to measure the thickness of the underlying nitride layer of the first substrate from the cassette (step 510). The thickness of the underlying layer is used by the controller to calculate an overpolish time (step 520), and this overpolish time is used to adjust the endpoint control timing (step 530). The substrate 10 is polished while being in-situ monitored by the monitoring system 40 (step 540). The polishing endpoint is detected as normal (step 550), but polishing is not halted immediately. Instead, the controller 32 causes the polisher to continue to polish the substrate for the previously calculated overpolish time (step 555). After the overpolish time has expired, polishing is terminated (step 560).

In effect, the overpolish time corrects for the distortion in the trace caused by variation in the underlying layer thickness that would cause the endpoint to be triggered too early. The relationship between the underlying layer thickness and the necessary overpolish time can be determined empirically or theoretically, and can be stored as a look-up-table or the like.

Still another problem in CMP polishing is measuring the thickness of a substrate that includes a thin layer, for example, an anti-reflective coating (ARC) layer covering the upper oxide layer. Typically, the thickness of the ARC is approximately about 150-300 Angstroms of TiN. Although the thickness of the ARC layer is usually fairly consistent within one cassette, the ARC layers can vary in thickness significantly from one cassette to another. Specifically, in some lots, cassette-to cassette thickness variations of the ARC layer can exceed 100%. The TiN reflectivity and, consequently, the phase of the ISRM reflected beam 46 vary significantly with the variations in the RCA layer thickness. This can cause large differences in the amplitude of the signal from the in-situ monitoring system 40. On the other hand, a measurement of the ARC layer with the in-line metrology device 35 alone may not be possible because of the small thickness of the layer.

FIG. 8 illustrates a method 600 according to another implementation of the invention. In method 600, an optical endpoint detection criteria is selected that ensures that the ARC layer will be removed but that resulting substrate will be somewhat underpolished (step 605). A first device substrate 17 from the cassette 12 is polished using this optical endpoint detection criteria (step 610). Since the ARC layer has been removed, the in-line metrology device 30 can be used, as described above, to measure the thickness of the layer remaining on the underpolished substrate 17 at the metrology station 30 (step 615). This thickness is used to calculate an overpolish time based on the post-CMP thickness of the underpolished substrate 17 and a desired target thickness (step 620). The target thickness is pre-determined data which is stored in the controller prior to the beginning of the polishing process. The overpolish time can be calculated from a polish rate measured during by the in-situ monitoring system during polishing and the desired thickness to be removed (calculated from the thickness remaining and the target thickness). The timing portion of the endpoint algorithm is adjusted to use the overpolish time (step 630).

Subsequent device substrates 10 (i.e., after the first substrate 17) are polished while being monitored by the optical monitoring system 40 (step 640), the endpoint detection algorithm is used with the polishing criteria previously calculated to provide an underpolished substrate (step 650), and after the optical endpoint criteria are detected, the polisher continues to polish for the overpolish time (step 660).

A number of embodiments of the invention have been described. Nevertheless, it will be understood that various modifications may be made without departing from the spirit and scope of the invention. Accordingly, other embodiments are within the scope of the following claims.

What is claimed is:

1. A computer-implemented method for process control in a chemical mechanical polishing, comprising:
    measuring an initial substrate thickness of a product substrate at a metrology station;
    polishing the product substrate;
    monitoring the product substrate in-situ during polishing with an in-situ monitoring system to determine a polishing rate;
    calculating an endpoint time from the initial substrate thickness and the polishing rate; and
    stopping polishing of the substrate when the endpoint time is detected.

2. The method of claim 1, further comprising calculating an estimated polishing time from the initial substrate thickness and a predetermined polishing rate.

3. The method of claim 2, wherein the predetermined polishing rate is a polishing rate of a previously polished substrate as measured by the in-situ monitoring system.

4. The method of claim 2, wherein the calculating step occurs at a predetermined percentage of the estimated polishing time.

5. The method of claim 4, wherein the predetermined percentage is about 80 to 90%.

6. The method of claim 1, wherein the in-situ monitoring system comprises an optical monitoring system.

7. A computer-implemented method for sequential process control in a chemical mechanical polishing, comprising:
  polishing a monitor substrate;
  monitoring the monitor substrate with an in-situ monitoring system to detect an intermediate endpoint criterion representing an underpolished state of the monitor substrate;
  stopping polishing of the monitor substrate when the intermediate endpoint criterion is detected;
  measuring a post-polishing thickness of the monitor substrate at a metrology station;
  calculating an overpolish time from a difference between the post-polishing thickness and a desired thickness;
  polishing a product substrate;
  monitoring the product substrate with the in-situ monitoring system to detect the intermediate endpoint criterion; and
  stopping polishing of the substrate when the overpolish time has elapsed after the intermediate endpoint criterion has been detected.

8. The method of claim 7, wherein the monitor substrate is a device substrate.

9. The method of claim 7, wherein the monitor substrate comprises a coating over a layer, and in the underpolished state the coating is removed.

10. The method of claim 9, wherein the coating comprises an anti-reflective coating.

11. The method of claim 9, wherein the layer comprises an oxide layer.

12. The method of claim 7, wherein the overpolish time is calculated from the difference and a polishing rate measured by the in-situ monitoring system during polishing.

13. The method of claim 7, wherein the in-situ monitoring system comprises an optical monitoring system.

\* \* \* \* \*